(12) United States Patent
Hsu et al.

(10) Patent No.: US 10,290,919 B2
(45) Date of Patent: May 14, 2019

(54) ELECTRONIC DEVICE

(71) Applicant: Wistron Corp., New Taipei (TW)

(72) Inventors: Yu Chen Hsu, New Taipei (TW);
Ching Pin Hsu, New Taipei (TW);
Chien An Chou, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 15/721,579

(22) Filed: Sep. 29, 2017

(65) Prior Publication Data

US 2019/0006736 A1 Jan. 3, 2019

(30) Foreign Application Priority Data

Jun. 30, 2017 (TW) .............................. 106121975 A

(51) Int. Cl.
*H01Q 1/22* (2006.01)
*H05K 5/02* (2006.01)
*G06F 1/16* (2006.01)

(52) U.S. Cl.
CPC ......... *H01Q 1/2266* (2013.01); *G06F 1/1618* (2013.01); *H05K 5/0226* (2013.01); *G06F 1/1662* (2013.01)

(58) Field of Classification Search
CPC ........ H01Q 1/2266; H01Q 1/084; H01Q 1/42; H01Q 1/2258; H01Q 11/14; H01Q 3/02; H01Q 9/42; G06F 1/1601; G06F 1/1618; G06F 1/16; G06F 1/1615; G06F 1/1637; G06F 1/1662; G06F 1/1681; G06F 1/1616; G06F 1/1633; G06F 1/203; H05K 5/02; H05K 5/0226
See application file for complete search history.

(56) References Cited

U.S. PATENT DOCUMENTS

| | | | | |
|---|---|---|---|---|
| 5,905,996 | A * | 5/1999 | Pawlowski | G06F 12/0895 365/205 |
| 6,353,733 | B1 * | 3/2002 | Murray | H04M 1/0216 343/702 |
| 9,252,480 | B2 * | 2/2016 | Chiu | H01Q 1/2266 |
| 2005/0104786 | A1 | 5/2005 | Kim | |
| 2007/0225052 | A1 * | 9/2007 | Yamazaki | H01Q 1/242 455/575.7 |
| 2011/0222260 | A1 * | 9/2011 | Goro | G06F 1/1681 361/814 |
| 2015/0102966 | A1 | 4/2015 | Chiu et al. | |
| 2017/0373375 | A1 * | 12/2017 | Bologna | H01Q 1/2266 |

* cited by examiner

*Primary Examiner* — Dimary S Lopez Cruz
*Assistant Examiner* — Ingrid D Wright

(57) ABSTRACT

An electronic device is provided, including a display module, an input module, a hinge module, and an antenna. The hinge module connects the display module and the input module and has a first side and an opposite second side. The antenna is disposed in the hinge module and is situated on the first side. When the display module is rotated with respect to the input module, the hinge module forces the antenna to move from the first side to the second side.

10 Claims, 7 Drawing Sheets

ELECTRONIC DEVICE

CROSS REFERENCE TO RELATED APPLICATIONS

This application claims the benefit of Taiwan Patent Application No. 106121975, filed on Jun. 30, 2017, the entirety of which is incorporated by reference herein.

BACKGROUND OF THE INVENTION

Field of the Invention

The application relates in general to an electronic device, and in particular to an electronic device that includes a movable antenna.

Description of the Related Art

The popularity of electronic devices such as desktop computers and laptop computers is increasing, and the demands on these increasingly indispensable electronic devices are also rapidly growing. A laptop computer with a touch screen and having a display that can be rotated 360 degrees has been available on the market, providing consumers a wealth of options.

The antenna of a conventional laptop computer is usually disposed on the top end of the screen. In response to the trend toward miniaturization of digital products and to enhance their appearance, the position of the antenna needs to be changed. However, the antenna of an electronic product will produce electromagnetic waves, and when these electromagnetic waves are too high, it may be harmful to the human body. Therefore, before an electronic product such as a laptop computer can be made commercially available, it is necessary to pass the Specific Absorption Rate (SAR) detection standard, which is a detection of the degree of absorption by a human body of the electromagnetic wave energy emitted by the product. In general, the farther the distance between the components of the product (which produce electromagnetic waves) and the human body, the lower the harm to the human body. Therefore, to provide a good product design and enable it to pass the SAR detection standard is an important issue.

BRIEF SUMMARY OF INVENTION

To address the deficiencies of conventional electronic devices, an embodiment of the invention provides an electronic device, including a display module, an input module, a hinge module, and an antenna. The hinge module connects the display module and the input module and has a first side and an opposite second side. The antenna is disposed in the hinge module and is situated on the first side. When the display module is rotated with respect to the input module, the hinge module forces the antenna to move from the first side to the second side.

In some embodiments, the hinge module has a central axis, and when the display module is rotated relative to the input module, the antenna moves along a direction that is perpendicular to the central axis.

In some embodiments, the hinge module has a guide portion and a rod portion, the guide portion connects to the rod portion, and when the display module is rotated relative to the input module, the guide portion forces the rod portion to move and the rod portion forces the antenna to move from the first side to second side.

In some embodiments, the hinge module has a first fixing member and a first shaft, the first fixing member connects the display module and the first shaft, and the guide portion is disposed on the first shaft.

In some embodiments, the rod portion has an elongated structure that extends along a direction that is perpendicular to the first shaft.

In some embodiments, the hinge module has a second fixing member and a second shaft, the second fixing member connects the input module and the second shaft, and the guide portion is disposed on the second shaft.

In some embodiments, the guide portion has a first gear and a second gear, the rod portion has a rack structure, and the second gear connects the first gear and the rack structure In some embodiments, the hinge module has a housing portion covering the antenna.

In some embodiments, when the display module is rotated relative to the input module into an expanded position, the display surface of the display module has its back to the input module.

In some embodiments, the display module is rotatable 360 degrees relative to the input module.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the electronic devices are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 1:
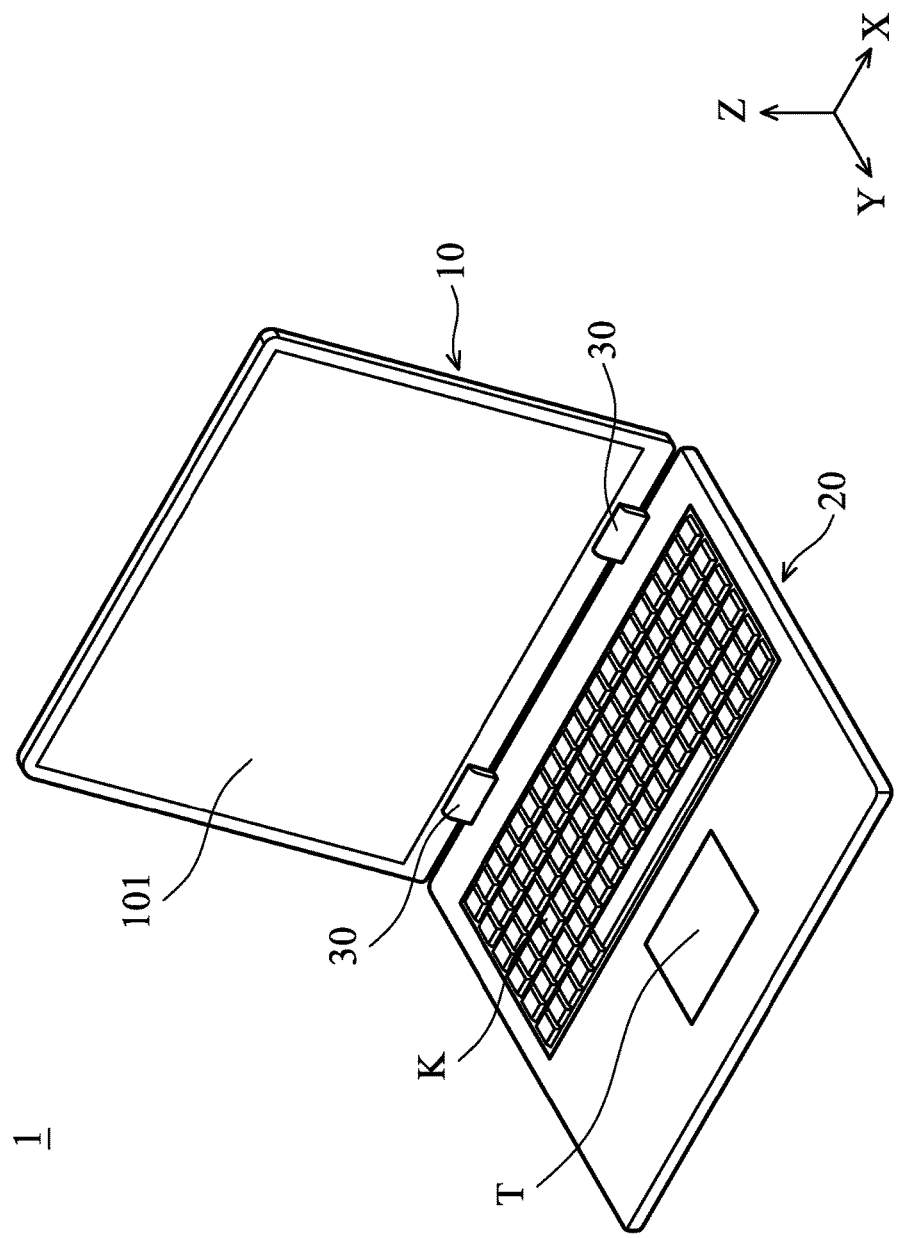
FIG. 1 is a schematic diagram of an electronic device according to an embodiment of the invention.

FIG. 1 is a schematic diagram of an electronic device 1 according to an embodiment of the invention. As shown in FIG. 1, the electronic device 1, for example, is a 360 degrees rotating laptop computer, primarily comprising a display module 10, an input module 20, and a plurality of hinge modules 30. The display module 10 may be a touch screen having a display surface 101. The input module 20 has a keyboard K and a touch panel T. A pair of hinge modules 30 are situated on the bottom of the display module 10 and connect the display module 10 to the input module 20, so that the display module 10 is rotatable with respect to the input module 20, so that the user can adjust the viewing angle.

Figure 2:
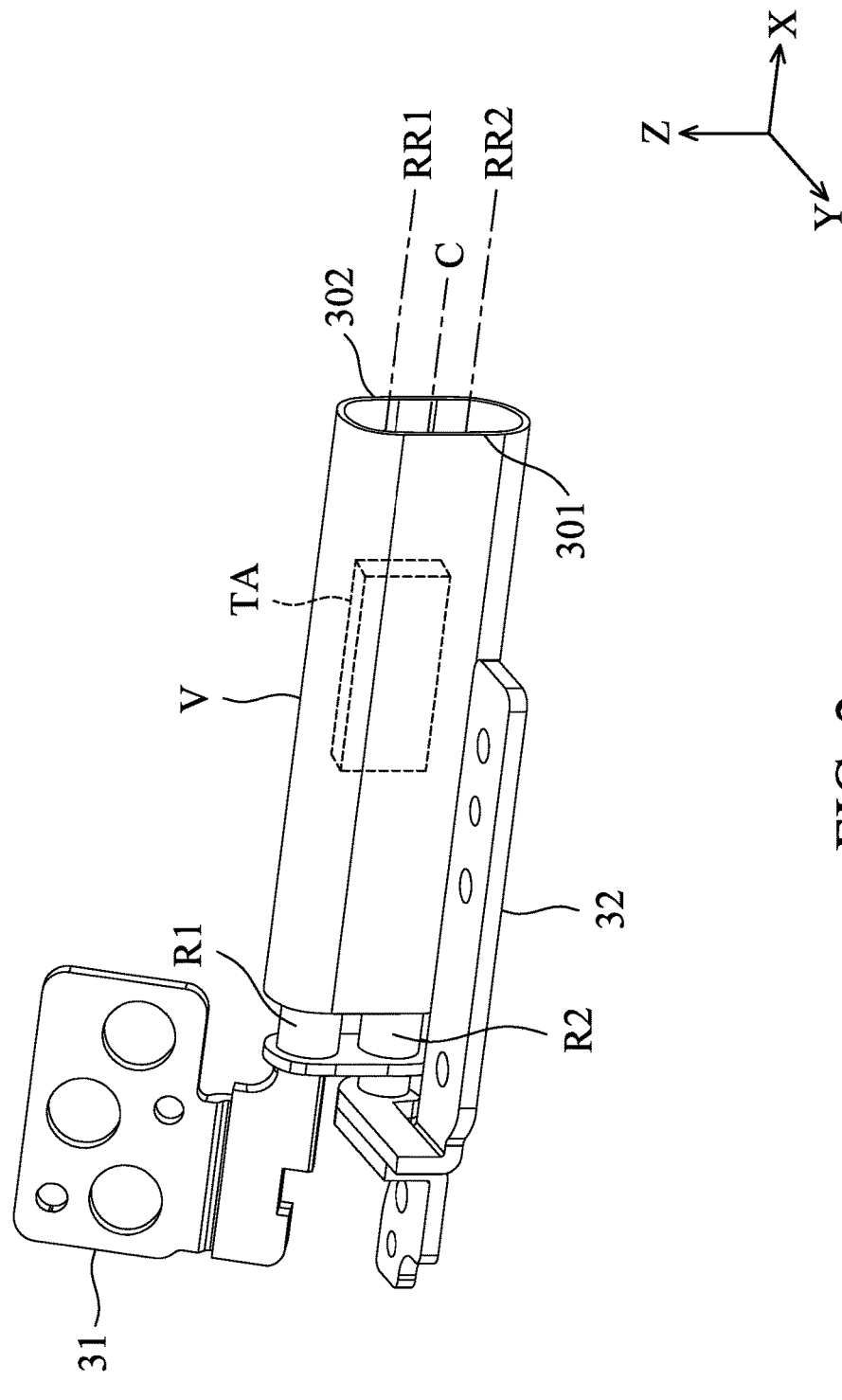
FIG. 2 is a schematic diagram of the hinge module 30 (the decorative shell is omitted).

FIG. 2 is a schematic diagram of the hinge module 30 situated on the left side of the electronic device 1 in FIG. 1 (the decorative shell in FIG. 1 is omitted). As shown in FIG. 2, the hinge module 30 has a first fixing member 31, a second fixing member 32, a first shaft R1, a second shaft R2, and a housing portion V. The first and second fixing members 31 and 32 are respectively fixed to the display module 10 and the input module 20 (may be fixed by a plurality of fasteners (such as screws) passing through the holes of the first and second fixing members 31 and 32) and are respectively connected to the first and second shafts R1 and R2. The first and second shafts R1 and R2 respectively have a first axis RR1 and a second axis RR2 which are parallel to the central axis C of the hinge module 30 (which extends along the long-axis). The first and second axes RR1 and RR2 are connected to each other and can rotate around one another so that the display module 10 can be rotated relative to the input module 20. Furthermore, the housing portion V at least partially covers the first and second shafts R1 and R2, wherein an antenna TA (indicated by the broken line in FIG. 2) is disposed in the hosing portion V and connects to the hinge module 30.

Figure 3:
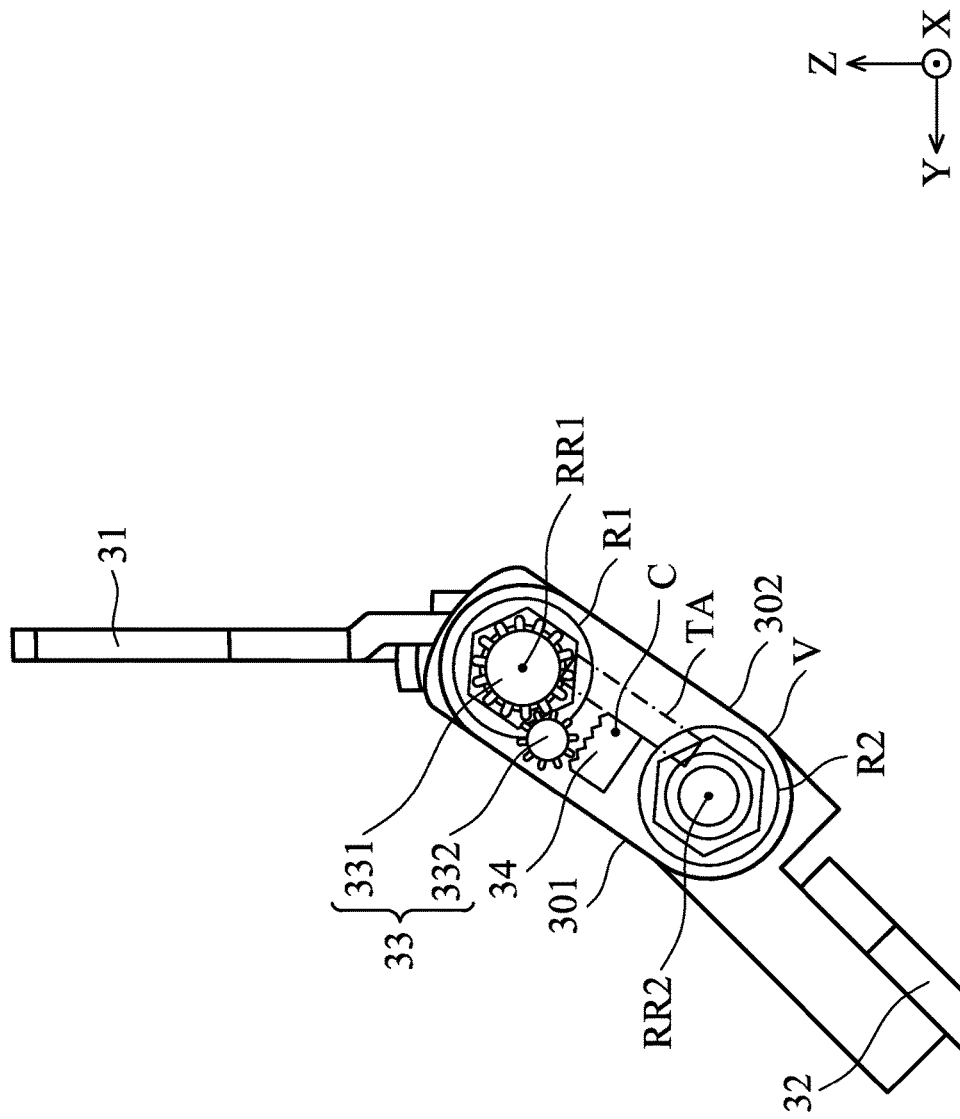
FIG. 3 is a side view diagram of the hinge module 30 in FIG. 2.

Specifically, as illustrated in FIGS. 2-3 (wherein FIG. 3 shows a side view of the hinge module 30 in FIG. 2), the hinge module 30 has a first side 301 and an opposite second side 302. The end of the first shaft R1 is provided with a guide portion 33 which is coupled with (or connected to) a rod portion 34 having an elongated structure, and one end of the rod portion 34 is connected to the antenna TA. The guide portion 33 has a first gear 331 and a second gear 332, and the rod portion 34 has a rack structure, wherein the second gear 332 is coupled with (or connected to) the first gear 331 and the rod portion 34. In some embodiments, the rod portion 34 is connected to the antenna TA by adhesion or by engagement, and a guide mechanism (e.g., a groove) corresponding to the rod portion 34 may be provided in the hinge module 30, to smoothly guide the motion of the rod portion 34.

The following will be described in detail: when the display module 10 is rotated with respect to the input module 20, the hinge module 30 forces (or drives) the antenna TA disposed therein to move. Please refer to FIGS. 4 to 6.

Figure 4:
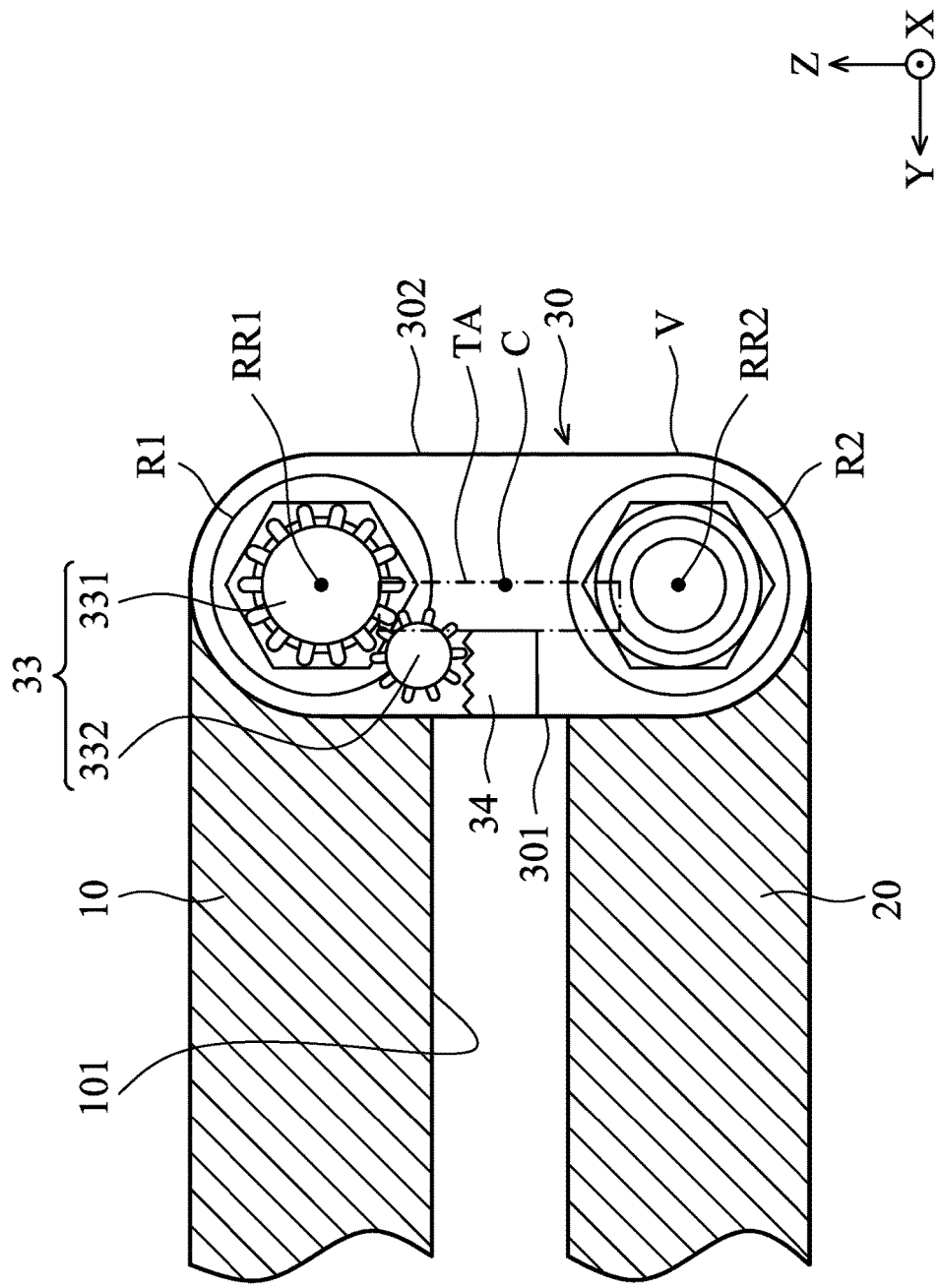
FIG. 4 is a schematic diagram of the electronic device in a closed position.
Figure 5:
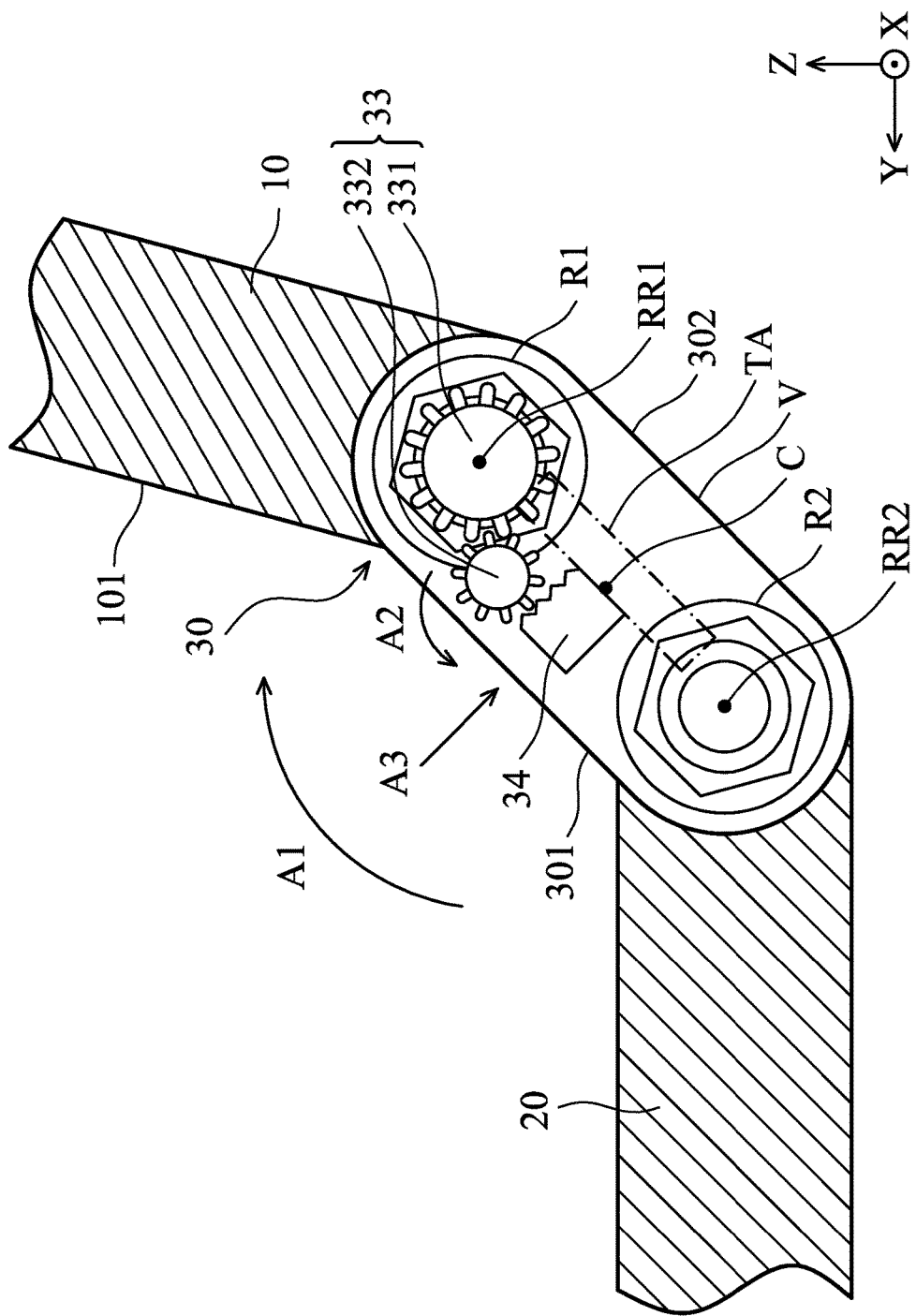
FIG. 5 is a schematic diagram of the electronic device in an open position.

FIGS. 4 and 5 are schematic diagrams of the electronic device in a closed position and an open position, respectively, wherein when in the closed position (FIG. 4), the display 101 of the surface display module 10 faces the input module 20. As shown in FIGS. 4 and 5, when the display module 10 is rotated relative to the input module 20 from the closed position (FIG. 4) to the open position (FIG. 5), the first shaft R1 rotates relative to the input module 20 in the direction A1, and the guide portion 33 (disposed on the first shaft R1) also rotates together (wherein the first gear 331 rotates in the direction A1; the second gear 332 rotates in the direction A2), to force the rod portion 34 to move.

More Specifically, by the rotations of the first and second gears 331 and 332, the rod portion 34 with the rack structure moves in a direction which is perpendicular to the central axis C of the hinge module 30 (or the first axis RR1 of the first shaft R1), such as direction A3 in FIG. 4. Thus, the antenna TA is remote from the first side 301 of the hinge module 30.

Figure 6:
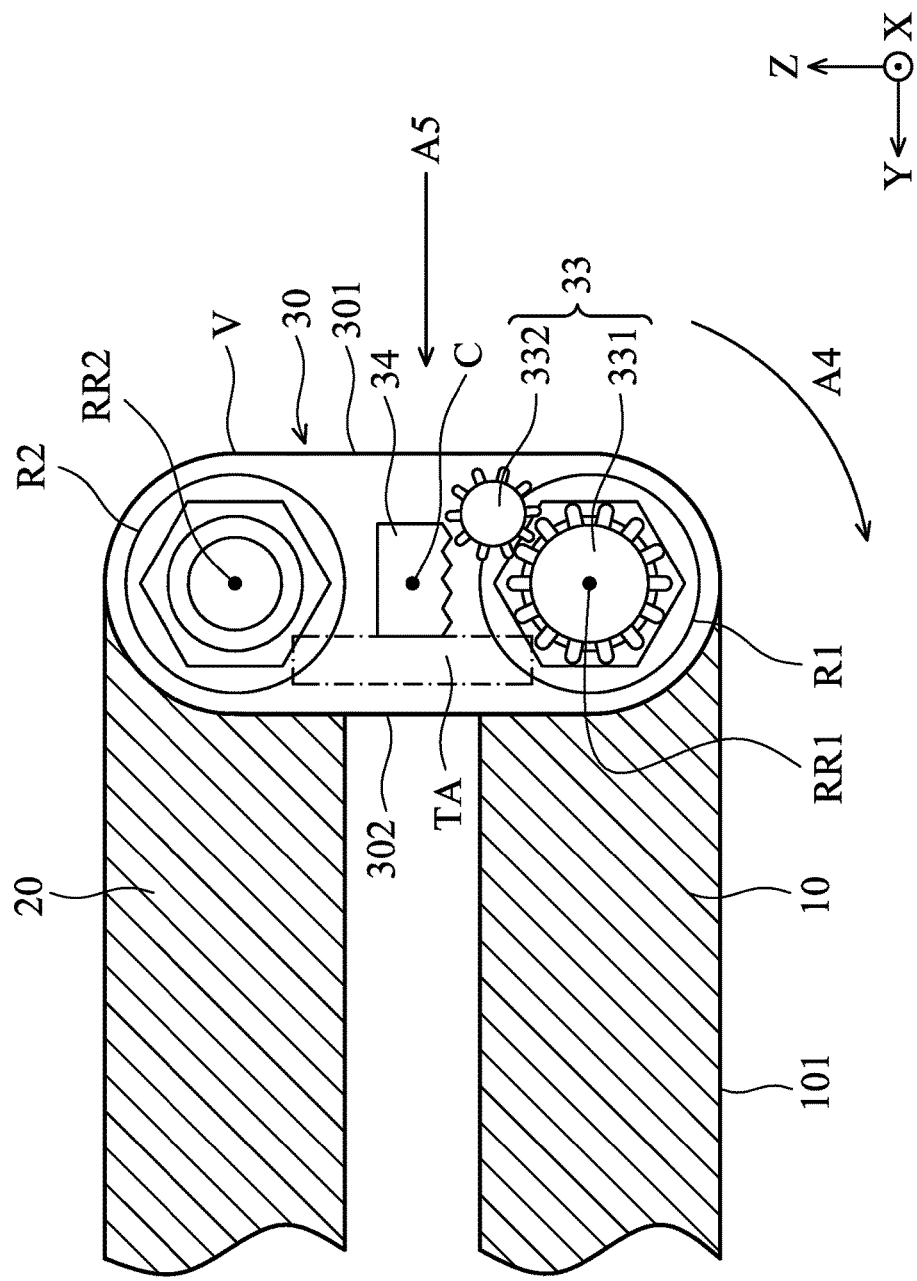
FIG. 6 is a schematic diagram of the electronic device in an expanded position (FIGS. 4-6 are schematic diagrams of the display module rotated relative to the input module).

Furthermore, as shown in FIGS. 5-6, when the display module 10 is continuously rotated relative to the display module 20 (in the direction A4) from the open position (FIG. 5) to the expanded position (FIG. 6), the electronic device 1 may be used as a tablet computer, and the display surface 101 of the display module 10 is facing away from (facing back to or facing backward) the input module 20. The rod portion 34 continuously moves in the direction which is perpendicular to the central axis C (such as direction A5 in FIG. 6) via the rotation of the first shaft R1 and of the guide portion 33, and the antenna TA is also forced and moves to the second side 302 of the hinge module 30. Similarly, when the electronic device 1 is restored from the expanded position to the closed position (please see FIGS. 6 to 4), the antenna TA moves from the second side 302 to the first side 301 forced (or driven) by the guide portion 33 and the rod portion 34.

Figure 7:
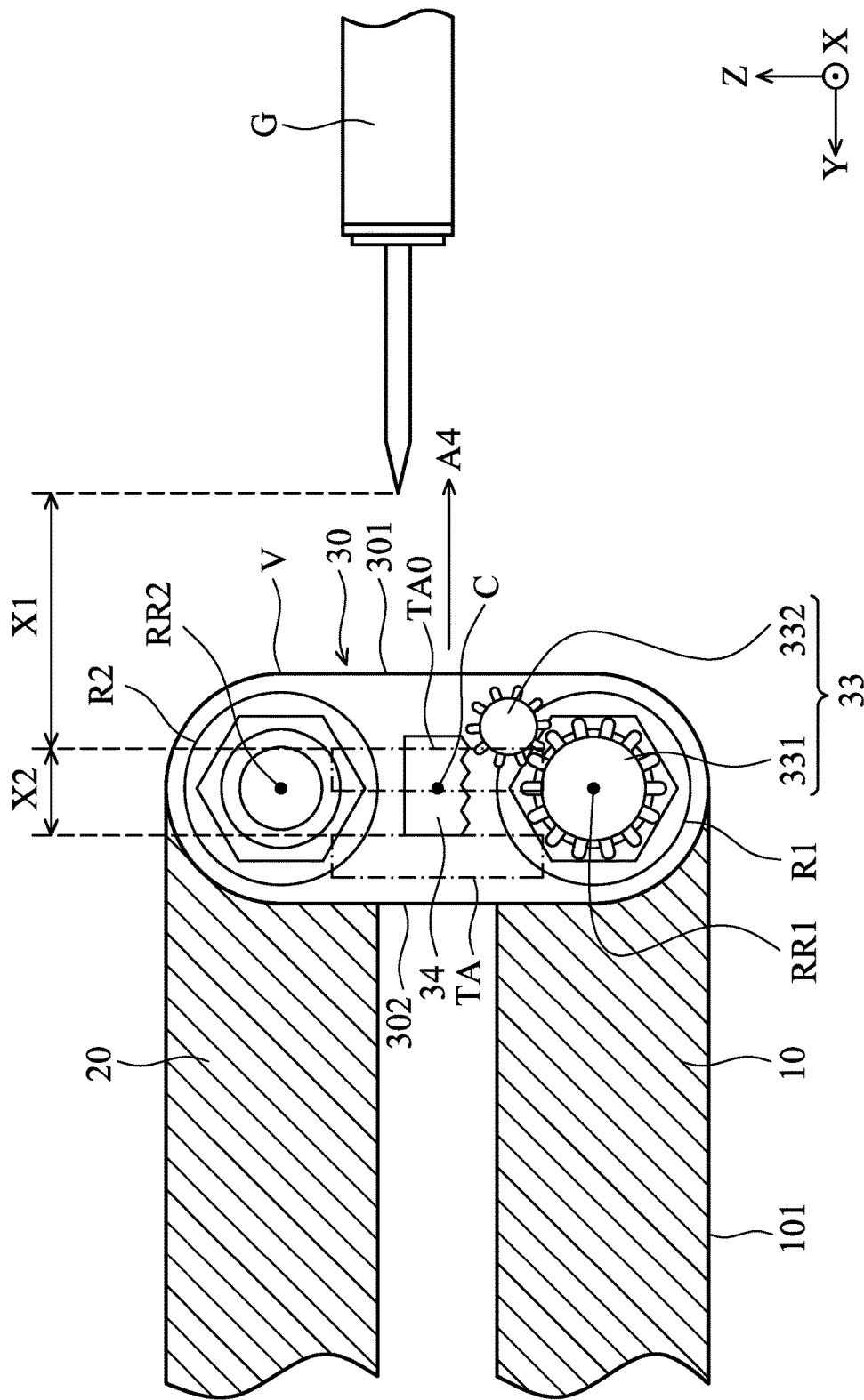
FIG. 7 is a schematic diagram of a detection tool G detecting the electromagnetic waves generated by the antenna TA.

Therefore, when the electronic device 1 goes from the closed position to the expanded position, the antenna TA disposed in the hinge module 30 moves from the first side 301 to the second side 302 of the hinge module 30. In other words, the antenna TA is displaced. When the electronic device 1 in the expanded position receives SAR (Specific Absorption Rate) detection, as shown in FIG. 7, there is a distance X1+X2 between the antenna TA and a SAR detection tool G for detecting the electromagnetic wave generated by the antenna TA. Compared to a non-displacement antenna TA0 of an electronic device (that is, the antenna TA0 will not move when from the closed position to the expanded position), there is only a distance X1 between the antenna TA0 and the detection tool G, which causes the electromagnetic wave energy detected by the detection tool G to be higher relative to the one in the present embodiment. That is, when the electronic device 1 of the present embodiment is in the expanded position, the antenna TA is remote from the bottom side of the electronic device 1 (the first side 301 of the hinge module 30). Thus, when a user uses the electronic device 1 in the expanded position, he or she can be far away from the antenna TA, thereby reducing the influence of electromagnetic waves. Therefore, the quality of the electronic apparatus 1 is effectively increased.

It should be understood that the other hinge module 30 situated on the right side of the electronic device 1 (FIG. 1) is substantially symmetrical to the hinge module 30 situated on the left side and has the same or similar components, and another antenna TA may be disposed therein, which are not described again here in detail.

In another embodiment, the guide portion 33 is provided at the end of the second shaft R2. When the input module 20 is rotated relative to the display module 10, the guide portion 33 and the rod portion 34 force (or drive) the antenna TA to move from the first side 301 to the second side 302. In another embodiment, the hinge module 30 may include only one shaft (single hinge) which connects the display module 10 and the input module 20 via the first and second fixing members 31 and 32 disposed in the hinge module 30, and the guide portion 33 is provided at one end of the single shaft. When the display module 10 is rotated with respect to the input module 20, the guide portion 33 and the rod portion 34 force the antenna TA to move from the first side 301 to the second side 302 of the hinge module 30.

In summary, an electronic device is provided, primarily including a display module, an input module, a hinge module, and an antenna. The hinge module connects the display module and the input module and has a first side and an opposite second side. The antenna is disposed in the hinge module and is situated on the first side. When the display module is rotated with respect to the input module from the closed position to the open position and the expanded position, the hinge module forces the antenna to move from the first side to the second side. Therefore, in the open position, the antenna is near the bottom side of the electronic device, to maintain good signal quality; in the expanded position, the antenna moves away from the bottom side of the electronic device, so that when a user uses the electronic device in the expanded position, the antenna in the present invention is farther away from the user than an antenna which does not move and would still be located on the bottom of the electronic device. As a result, the harm to the human body caused by electromagnetic waves generated by the antenna is reduced, and the performance of the electronic device is improved. In addition, by providing a guide portion and a rod portion on the shaft to force the antenna to move, the kinetic energy of the rotation of the display module can be applied to the antenna, so that the additional forcing/driving mechanisms can be saved, to reduce the production and assembly cost.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:

1. An electronic device, comprising:
   a display module;
   an input module;
   a hinge module, connecting the display module and the input module and having a first side and an opposite second side; and
   an antenna, disposed in the hinge module and situated on the first side, wherein when the display module is rotated relative to the input module, the hinge module forces the antenna to linearly move from the first side to the second side in the hinge module along a direction perpendicular to an inner surface of the second side.

2. The electronic device as claimed in claim 1, wherein the hinge module has a central axis, and when the display module is rotated relative to the input module, the antenna moves along a direction perpendicular to the central axis.

3. The electronic device as claimed in claim 1, wherein the hinge module has a guide portion and a rod portion, the guide portion connects to the rod portion, and when the display module is rotated relative to the input module, the guide portion forces the rod portion to move and the rod portion forces the antenna to move from the first side to the second side.

4. The electronic device as claimed in claim 3, wherein the hinge module has a first fixing member and a first shaft, the first fixing member connects the display module and the first shaft, and the guide portion is disposed on the first shaft.

5. The electronic device as claimed in claim 4, wherein the rod portion has an elongated structure that extends along a direction perpendicular to the first shaft.

6. The electronic device as claimed in claim 3, wherein the hinge module has a second fixing member and a second shaft, the second fixing member connects the input module and the second shaft, and the guide portion is disposed on the second shaft.

7. The electronic device as claimed in claim 3, wherein the guide portion has a first gear and a second gear, the rod portion has a rack structure, and the second gear connects the first gear and the rack structure.

8. The electronic device as claimed in claim 1, wherein the hinge module has a housing portion covering the antenna.

9. The electronic device as claimed in claim 1, wherein when the display module is rotated relative to the input module into an expanded position, a display surface of the display module is facing backward the input module.

10. The electronic device as claimed in claim 1, wherein the display module is rotatable 360 degrees relative to the input module.

* * * * *